US012727331B2

(12) United States Patent
Kim et al.

(10) Patent No.: US 12,727,331 B2
(45) Date of Patent: Sep. 1, 2026

(54) DISPLAY APPARATUS

(71) Applicant: Samsung Display Co., Ltd., Yongin-si (KR)

(72) Inventors: Jangil Kim, Yongin-si (KR); Jonghoon Kim, Yongin-si (KR); Kyounghae Min, Yongin-si (KR); Jiseong Yang, Yongin-si (KR); Hyejun Woo, Yongin-si (KR); Myoungjong Lee, Yongin-si (KR); Seongyeon Lee, Yongin-si (KR); Sujin Lee, Yongin-si (KR); Siwan Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 548 days.

(21) Appl. No.: 18/177,597

(22) Filed: Mar. 2, 2023

(65) Prior Publication Data

US 2023/0284483 A1 Sep. 7, 2023

(30) Foreign Application Priority Data

Mar. 2, 2022 (KR) ........................ 10-2022-0026909

(51) Int. Cl.
*H10K 59/122* (2023.01)
*H10K 59/38* (2023.01)
*H10K 59/80* (2023.01)

(52) U.S. Cl.
CPC ........... *H10K 59/122* (2023.02); *H10K 59/38* (2023.02); *H10K 59/879* (2023.02)

(58) Field of Classification Search
CPC ..... H10K 59/122; H10K 59/38; H10K 59/879
See application file for complete search history.

(56) References Cited

U.S. PATENT DOCUMENTS

| | | | |
|---|---|---|---|
| 10,872,931 | B2 | 12/2020 | Kim et al. |
| 11,061,268 | B2 | 7/2021 | Park et al. |
| 2007/0157839 | A1 | 7/2007 | Kim et al. |
| 2019/0355935 | A1 | 11/2019 | Jung et al. |
| 2020/0066803 | A1 | 2/2020 | Kim et al. |
| 2020/0394955 | A1 | 12/2020 | Lee |
| 2021/0351238 | A1 | 11/2021 | Park et al. |
| 2021/0359011 | A1 | 11/2021 | Lee |

(Continued)

FOREIGN PATENT DOCUMENTS

| | | | |
|---|---|---|---|
| CN | 111736388 | A | 10/2020 |
| EP | 3958026 | A1 | 2/2022 |

(Continued)

OTHER PUBLICATIONS

EPO Extended European Search Report dated Jun. 12, 2023, issued in corresponding European Patent Application No. 23158757.7 (15 pages).

*Primary Examiner* — Jay C Kim
*Assistant Examiner* — Woo K Lee
(74) *Attorney, Agent, or Firm* — Womble Bond Dickinson (US) LLP

(57) ABSTRACT

A display apparatus includes: a first substrate; a bank on the first substrate and comprising a first well, a second well, a third well, a fourth well, and auxiliary wells; a first quantum dot layer in the first well; and a second quantum dot layer in the second well, wherein the first well, the second well, the third well, and the fourth well are spaced apart from one another with the auxiliary wells therebetween.

20 Claims, 12 Drawing Sheets

(56) References Cited

U.S. PATENT DOCUMENTS

| | | | |
|---|---|---|---|
| 2021/0384274 A1 | 12/2021 | Ahn et al. | |
| 2021/0408162 A1 | 12/2021 | Joo et al. | |
| 2022/0231087 A1* | 7/2022 | Jeon | H10K 59/38 |
| 2022/0359798 A1 | 11/2022 | Kim et al. | |

FOREIGN PATENT DOCUMENTS

| | | |
|---|---|---|
| JP | 2006-072176 A | 3/2006 |
| JP | 2016-015292 A | 1/2016 |
| KR | 10-0790866 B1 | 1/2008 |
| KR | 10-2020-0000840 A | 1/2020 |
| KR | 10-2020-0023964 A | 3/2020 |
| KR | 10-2020-0047947 A | 5/2020 |
| KR | 10-2021-0000184 A | 1/2021 |
| KR | 10-2022-0000003 A | 1/2022 |
| KR | 10-2022-0014426 A | 2/2022 |
| KR | 10-2022-0105253 A | 7/2022 |
| KR | 10-2022-0152463 A | 11/2022 |

* cited by examiner

A2
412
420
425
410
430
AOP
504
502
321
225a
223
221
225b
220
PX2
400a
400
400b
500
600
305
303
150
140
131
121
110
100
II
II'
X
Y
Z

A1
A3
421
410 415
423
430 435
420
501
503
AOP
311
331
215b 211 213 215a
210
235b 231 233 235a
230
PX1
PX3
400a
400
400b
900
800
500
600
305
303
150
140
131
121
110
100
X
Y
Z

A2
412
420 425
430
410
400a
400
400b
900
800
500
600
502
AOP
504
305
303
150
321
140
131
121
110
100
225b 221 223 225a
220
PX2
Y
X
Z

DISPLAY APPARATUS

CROSS-REFERENCE TO RELATED APPLICATION

The present application claims priority to and the benefit of Korean Patent Application No. 10-2022-0026909, filed on Mar. 2, 2022, in the Korean Intellectual Property Office, the entire disclosure of which is incorporated herein by reference.

BACKGROUND

1. Field

Aspects of one or more embodiments relate to a display apparatus.

2. Description of the Related Art

A display apparatus includes a plurality of pixels. In order to enable a full-color display apparatus, each pixel may emit light of a different color. To this end, at least some pixels of the display apparatus include a color conversion unit. Accordingly, light having a wavelength in a first wavelength band generated by a light emitter of some pixels may be converted into light having a wavelength in a second wavelength band while passing through a corresponding color conversion unit and may be extracted to the outside.

The above information disclosed in this Background section is only for enhancement of understanding of the background and therefore the information discussed in this Background section does not necessarily constitute prior art.

SUMMARY

Aspects of one or more embodiments relate to a display apparatus, and for example, to a display apparatus capable of reducing the risk of defects in a manufacturing process.

A display apparatus may have a problem in that defects are likely to occur in a manufacturing process.

One or more embodiments include a display apparatus that may have a relatively reduced risk of defects in a manufacturing process. However, the embodiments are examples, and do not limit the scope of the disclosure.

Additional aspects will be set forth in part in the description which follows and, in part, will be apparent from the description, or may be learned by practice of the presented embodiments.

According to one or more embodiments, a display apparatus includes a first substrate, a bank located on the first substrate and including a first well, a second well, a third well, a fourth well, and auxiliary wells, a first quantum dot layer located in the first well, and a second quantum dot layer located in the second well, wherein the first well, the second well, the third well, and the fourth well are spaced apart from one another with the auxiliary wells therebetween.

According to some embodiments, the first quantum dot layer may be configured to convert light having a wavelength in a first wavelength band passing through the first quantum dot layer into light having a wavelength in a second wavelength band, and the second quantum dot layer may be configured to convert light having a wavelength in the first wavelength band passing through the second quantum dot layer into light having a wavelength in a third wavelength band.

According to some embodiments, the second wavelength band may include a wavelength ranging from 630 nm to 780 nm, wherein the auxiliary wells include a first auxiliary well adjacent to the first well, and an area of the first auxiliary well is equal to or less than 27% of an area of the first well.

According to some embodiments, the third wavelength band may include a wavelength ranging from 495 nm to 570 nm, wherein the auxiliary wells include a second auxiliary well adjacent to the second well, and an area of the second auxiliary well is equal to or less than 45% of an area of the second well.

According to some embodiments, the display apparatus may further include a light-transmitting layer located in the third well and configured to transmit incident light, wherein the auxiliary wells include a third auxiliary well adjacent to the third well, and an area of the third auxiliary well is equal to or less than 77% of an area of the third well.

According to some embodiments, the auxiliary wells may include a first auxiliary well adjacent to the first well, a second auxiliary well adjacent to the second well, and a third auxiliary well adjacent to the third well, wherein an area of the first auxiliary well adjacent to the first well from among the auxiliary wells is equal to or less than 27% of an area of the first well, an area of the second auxiliary well adjacent to the second well from among the auxiliary wells is equal to or less than 45% of an area of the second well, and an area of the third auxiliary well adjacent to the third well from among the auxiliary wells is equal to or less than 77% of an area of the third well.

According to some embodiments, each of the auxiliary wells may be adjacent to at least one of the first well, the second well, or the third well, wherein an area of each of the auxiliary wells is equal to or less than 23% of an area of the adjacent well.

According to some embodiments, the first well and the third well may be alternately arranged on a first imaginary line extending in a first direction, and the second well and the fourth well may be alternately arranged on a second imaginary line that is parallel to the first imaginary line and is spaced apart from the first imaginary line in a second direction that intersects the first direction.

According to some embodiments, a center of the first well and a center of the third well located on the first imaginary line may be located between a center of the second well and a center of the fourth well located on the second imaginary line.

According to some embodiments, each of the first well, the second well, and the third well may have a quadrangular shape in a plan view, and the fourth well may have an octagonal shape in a plan view.

According to some embodiments, each of the first well, the second well, and the third well may have a quadrangular shape with a chamfered corner in a plan view.

According to some embodiments, the display apparatus may further include color filters located between the first substrate, and the first quantum dot layer, the second quantum dot layer, and the bank.

According to some embodiments, the display apparatus may further include a low-refractive index layer located between the color filters, and the first quantum dot layer, the second quantum dot layer, and the bank.

According to some embodiments, the display apparatus may further include an additional protective layer located between the low-refractive index layer, and the first quantum dot layer, the second quantum dot layer, and the bank.

According to some embodiments, the bank may include partition walls defining the first well, the second well, the third well, the fourth well, and the auxiliary wells, wherein a width of each of the partition walls ranges from 13 μm to 15 μm.

According to some embodiments, the display apparatus may further include a second substrate located under the first substrate with the bank therebetween, a first pixel electrode corresponding to the first well, a second pixel electrode corresponding to the second well, and a third pixel electrode corresponding to the third well, the first, second, and third pixel electrodes being located on the second substrate to be spaced apart from one another, a pixel-defining film covering an edge of each of the first pixel electrode, the second pixel electrode, and the third pixel electrode, the pixel-defining film including an opening through which a central portion of the first pixel electrode is exposed, an opening through which a central portion of the second pixel electrode is exposed, and an opening through which a central portion of the third pixel electrode is exposed, an emission layer located on the first pixel electrode through the third pixel electrode and configured to emit light having a wavelength in a first wavelength band, and a counter electrode located on the emission layer.

According to some embodiments, the display apparatus may further include a spacer located between the pixel-defining film and the bank, wherein the bank includes a support for supporting the spacer.

According to some embodiments, the display apparatus may further include the support overlaps the fourth well in a plan view.

According to some embodiments, the auxiliary wells may include a fourth auxiliary well adjacent to the fourth well, and the support may overlap the fourth auxiliary well in a plan view.

According to some embodiments, the auxiliary wells may have a polygonal shape in which at least one interior angle is an obtuse angle in a plan view.

Other aspects, features, and characteristics of embodiments according to the present disclosure will become more apparent from the drawings, the claims, and the detailed description.

BRIEF DESCRIPTION OF THE DRAWINGS

The above and other aspects, features, and characteristics of certain embodiments will be more apparent from the following description taken in conjunction with the accompanying drawings, in which.

DETAILED DESCRIPTION

Figure 1:
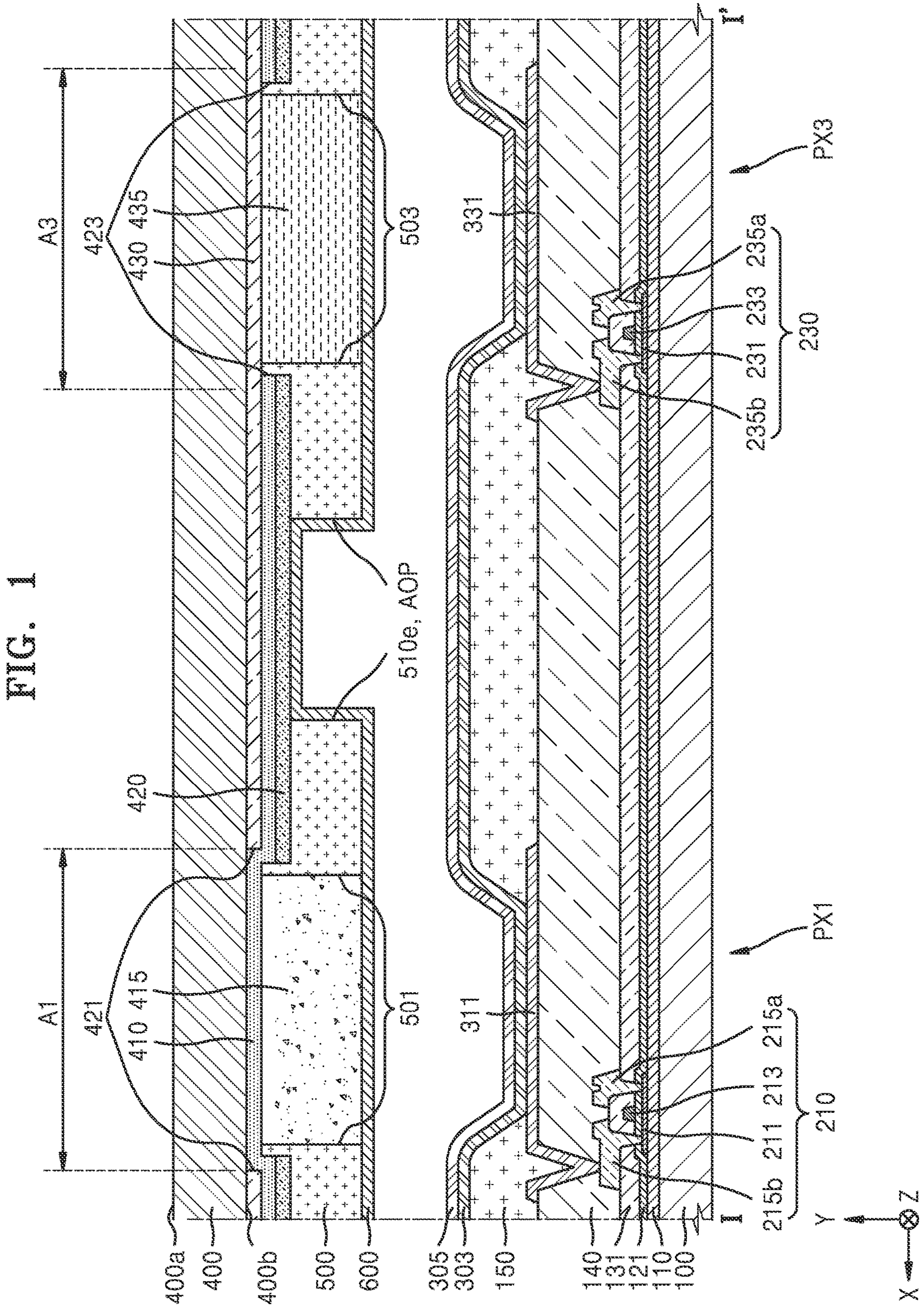
FIG. 1 is a cross-sectional view schematically illustrating a part of a display apparatus, according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, aspects of some embodiments will be described in more detail with reference to the accompanying drawings, wherein the same or corresponding elements are denoted by the same reference numerals throughout and a repeated description thereof is omitted.

While the terms as "first," "second," etc., may be used to describe various components, such components are not be limited to the above terms. The above terms are used only to distinguish one component from another.

The singular forms "a," "an," and "the" as used herein are intended to include the plural forms as well unless the context clearly indicates differently.

In the specification, it is to be understood that the terms "including," "having," and "comprising" are intended to indicate the existence of features or components described in the specification, and are not intended to preclude the possibility that one or more other features or components may be added.

In the specification, it will be further understood that, when a layer, region, or component is referred to as being "on" another layer, region, or component, it may be directly on the other layer, region, or component, or may be indirectly on the other layer, region, or component with intervening layers, regions, or components therebetween.

In the specification, it will be understood that when a layer, an area, or a component is referred to as being "connected" to another layer, area, or component, it may be "directly connected" to the other layer, area, or component and/or may be "indirectly connected" to the other layer, area, or component with other layers, areas, or components interposed therebetween. For example, when a layer, an area, or a component is referred to as being "electrically connected," it may be directly electrically connected, and/or may be indirectly electrically connected with intervening layers, areas, or components therebetween.

"A and/or B" is used herein to select only A, select only B, or select both A and B. "At least one of A and B" is used to select only A, select only B, or select both A and B.

In the specification, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the specification, when a certain embodiment may be implemented differently, a specific process order may be different from the described order. For example, two consecutively described processes may be performed substantially at the same time or may be performed in an order opposite to the described order.

Sizes of components in the drawings may be exaggerated or contracted for convenience of explanation. For example, because sizes and thicknesses of elements in the drawings are arbitrarily illustrated for convenience of explanation, the disclosure is not limited thereto.

Figure 2:
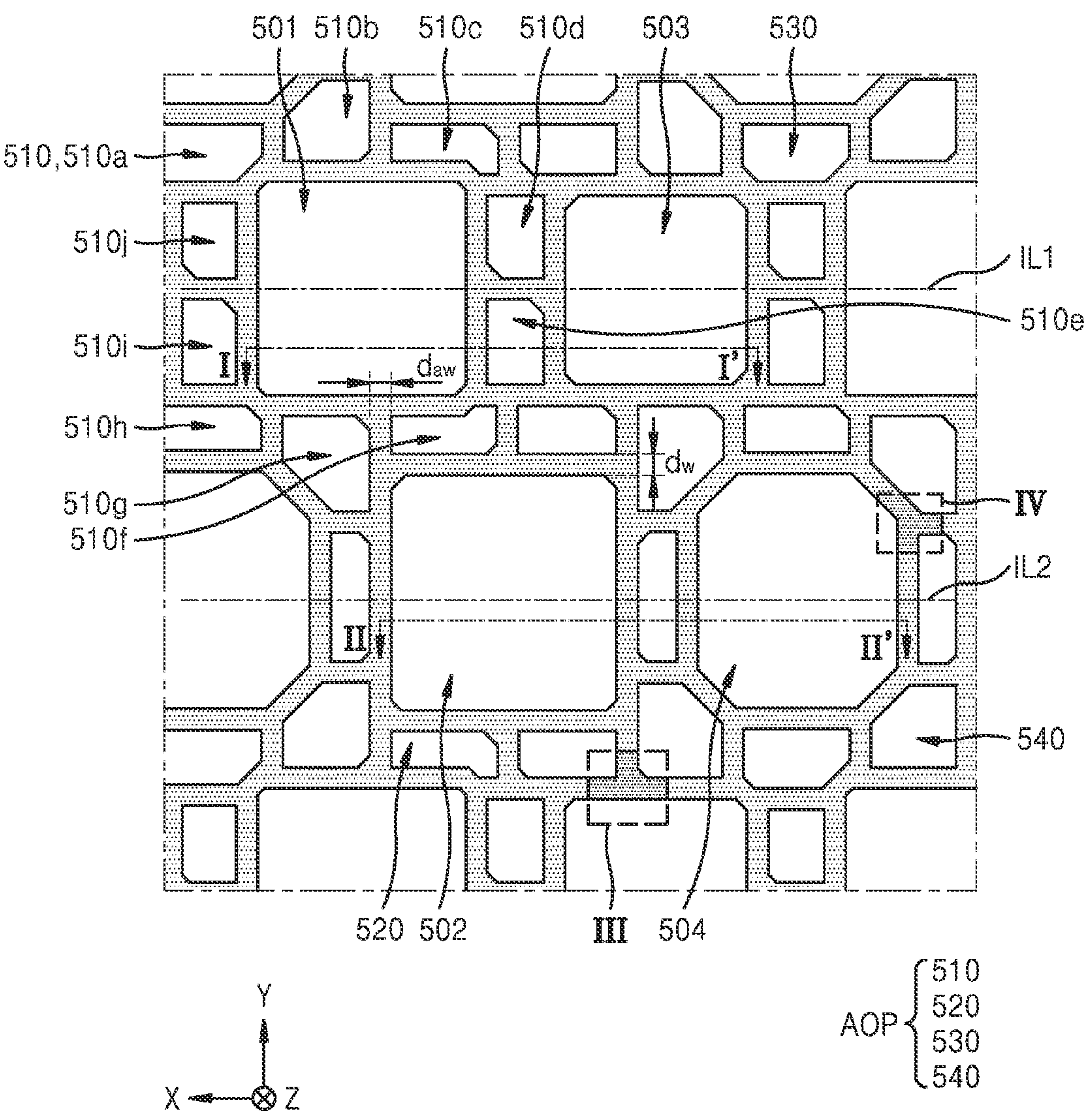
FIG. 2 is a plan view schematically illustrating a part of a display apparatus, according to some embodiments.
Figure 3:
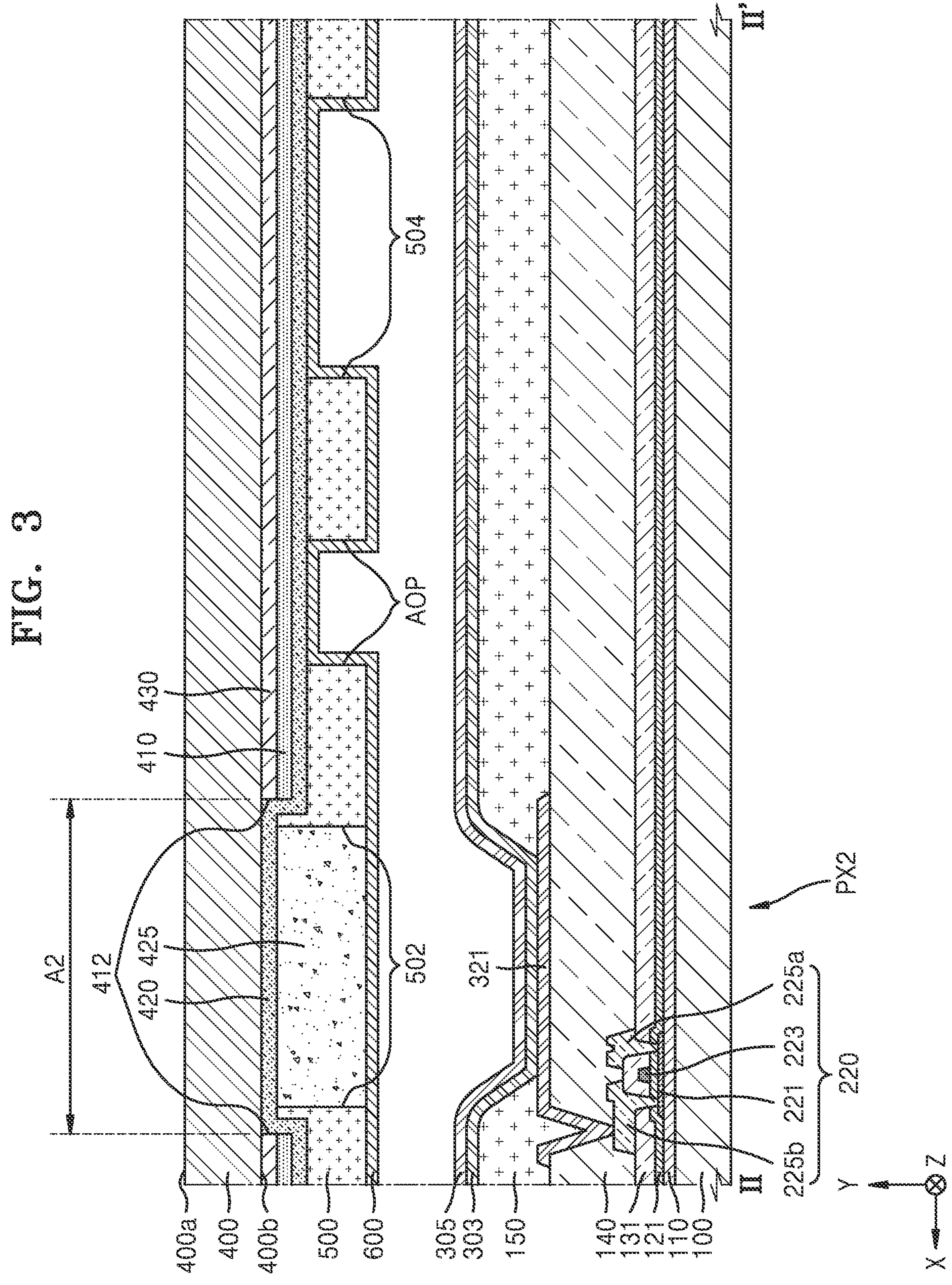
FIG. 3 is a cross-sectional view schematically illustrating the display apparatus of FIG. 2 taken along the line II-II' of FIG. 2 according to some embodiments.

FIG. 1 is a cross-sectional view schematically illustrating a part of a display apparatus, according to some embodiments. FIG. 2 is a plan view schematically illustrating a part of the display apparatus of FIG. 1. FIG. 3 is a cross-sectional view schematically illustrating the display apparatus of FIG. 2 taken along the line II-II' of FIG. 2. FIG. 1 may schematically illustrate the display apparatus of claim 2 taken along the line I-I' of FIG. 2.

The display apparatus according to some embodiments includes a second substrate 100 (lower substrate), and a first pixel electrode 311, a second pixel electrode 321, and a third pixel electrode 331 located on the second substrate 100, a pixel-defining film 150, a first substrate 400 (upper substrate), and a bank 500.

The second substrate 100 may include glass, a metal, or a polymer resin. The second substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. Various modifications may be made. For example, the second substrate 100 may have a multi-layer structure including two layers each including a polymer resin and a barrier layer including an inorganic material (e.g., silicon oxide, silicon nitride, or silicon oxynitride) and located between the two layers.

The first pixel electrode 311, the second pixel electrode 321, and the third pixel electrode 331 are located on the second substrate 100. In addition to the first pixel electrode 311, the second pixel electrode 321, and the third pixel electrode 331, a first thin-film transistor 210, a second thin-film transistor 220, and a third thin-film transistor 230 respectively electrically connected to the first pixel electrode 311, the second pixel electrode 321, and the third pixel electrode 331 may be located on the second substrate 100. That is, as shown in FIGS. 1 and 3, the first pixel electrode 311 may be electrically connected to the first thin-film transistor 210, the second pixel electrode 321 may be electrically connected to the second thin-film transistor 220, and the third pixel electrode 331 may be electrically connected to the third thin-film transistor 230. The first pixel electrode 311, the second pixel electrode 321, and the third pixel electrode 331 may be located on a planarization layer 140 located on the second substrate 100.

A buffer layer 110 including an inorganic material such as silicon oxide, silicon nitride, and/or silicon oxynitride may be located between the second substrate 100, and the first transistor 210, the second thin-film transistor 220, and the third thin-film transistor 230. The buffer layer 110 may planarize a top surface of the second substrate 100, or may prevent, reduce, or minimize impurities from the second substrate 100 or the like from penetrating into a first semiconductor layer 211 of the first thin-film transistor 210.

The first thin-film transistor 210 that drives a first pixel PX1 may include the first semiconductor layer 211 including amorphous silicon, polycrystalline silicon, an organic semiconductor material, or an oxide semiconductor material, a first gate electrode 213, a first source electrode 215*a*, and a first drain electrode 215*b*. The first gate electrode 213 may include any of various conductive materials and may have any of various layer structures.

For example, the first gate electrode 213 may include a molybdenum (Mo) layer and an aluminum (Al) layer. In this case, the first gate electrode 213 may have a layer structure including Mo/Al/Mo. Alternatively, the first gate electrode 213 may include a TiNx layer, an aluminum (Al) layer, and/or a titanium (Ti) layer. Each of the first source electrode 215*a* and the first drain electrode 215*b* may also have any of various conductive materials and may have any of various layer structures. For example, each of the first source electrode 215*a* and the first drain electrode 215*b* may include a Ti layer, an Al layer, and/or a copper (Cu) layer. In this case, each of the first source electrode 215*a* and the first drain electrode 215*b* may have a layer structure including Ti/Al/Ti.

In order to ensure insulation between the first semiconductor layer 211 and the first gate electrode 213, a gate insulating film 121 including an inorganic material such as silicon oxide, silicon nitride, and/or silicon oxynitride may be located between the first semiconductor layer 211 and the first gate electrode 213. An interlayer insulating film 131 including an inorganic material such as silicon oxide, silicon nitride, and/or silicon oxynitride may be located on the first gate electrode 213, and the first source electrode 215*a* and the first drain electrode 215*b* may be located on the interlayer insulating film 131. Such an insulating film including an inorganic material may be formed by using chemical vapor deposition (CVD) or atomic layer deposition (ALD). This applies to the following embodiments and modifications thereof.

The second thin-film transistor 220 that drives a second pixel PX2 may include a second semiconductor layer 221, a second gate electrode 223, a second source electrode 225*a*, and a second drain electrode 225*b*. The third thin-film transistor 230 that drives a third pixel PX3 may include a third semiconductor layer 231, a third gate electrode 233, a third source electrode 235*a*, and a third drain electrode 235*b*. A structure of the second thin-film transistor 220 and a structure of the third thin-film transistor 230 are the same as or similar to a structure of the first thin-film transistor 210 that drives the first pixel PX1, and thus, a description thereof will be omitted.

The planarization layer 140 may be located on the first thin-film transistor 210, the second thin-film transistor 220, and the third thin-film transistor 230. For example, when an organic light-emitting device including the first pixel electrode 311 is located on the first thin-film transistor 210 as shown in FIG. 1, the planarization layer 140 may substantially planarize a top surface of a protective film that covers the first thin-film transistor 210. The planarization layer 140 may include an organic material such as acryl, benzocyclobutene (BCB), or hexamethyldisiloxane (HMDSO). Although the planarization layer 140 has a single-layer structure in FIGS. 1 and 3, various modifications may be made. For example, the planarization layer 140 may have a multi-layer structure.

The organic light-emitting device including the first pixel electrode 311, a counter electrode 305, and an intermediate layer 303 located between the first pixel electrode 311 and the counter electrode 305 and including an emission layer may be located to correspond to the first pixel PX1. The first pixel electrode 311 is electrically connected to the first thin-film transistor 210 by contacting any one of the first source electrode 215*a* and the first drain electrode 215*b* through a contact hole formed in the planarization layer 140 as shown in FIG. 1. The first pixel electrode 311 includes a light-transmitting conductive layer formed of a light-transmitting conductive oxide such as ITO, $In_2O_3$, or IZO, and a reflective layer formed of a metal such as Al or Ag. For example, the first pixel electrode 311 may have a three-layer structure including ITO/Ag/ITO.

Likewise, an organic light-emitting device including the second pixel electrode 321, the counter electrode 305, and the intermediate layer 303 located between the second pixel electrode 321 and the counter electrode 305 and including an emission layer may be located to correspond to the second pixel PX2. An organic light-emitting device including the third pixel electrode 331, the counter electrode 305, and the intermediate layer 303 located between the third pixel electrode 331 and the counter electrode 305 and including an emission layer may be located to correspond to the third pixel PX3. The second pixel electrode 321 is electrically connected to the second thin-film transistor 220 by contacting any one of the second source electrode 225*a* and the second drain electrode 225*b* through a contact hole formed in the planarization layer 140. The third pixel electrode 331 is electrically connected to the third thin-film transistor 230 by contacting any one of the third source electrode 235*a* and the third drain electrode 235*b* through a contact hole formed in the planarization layer 140. The description of the first pixel electrode 311 may be applied to the second pixel electrode 321 and the third pixel electrode 331.

As described above, the intermediate layer 303 including the emission layer may be located on the first pixel electrode 311 of the first pixel PX1, the second pixel electrode 321 of the second pixel PX2, and the third pixel electrode 331 of the third pixel PX3. According to some embodiments, the intermediate layer 303 may be integrally formed over the first pixel electrode 311, the second pixel electrode 321, and the third pixel electrode 331. According to some embodiments, the intermediate layer 303 may be patterned and located on the first pixel electrode 311, the second pixel electrode 321, and the third pixel electrode 331. The intermediate layer 303 may include a hole injection layer, a hole transport layer, and/or an electron transport layer when necessary in addition to the emission layer. Some of the layers included in the intermediate layer 303 may be integrally formed over the first pixel electrode 311 through the third pixel electrode 331, and other layers may be patterned and located on the first pixel electrode 311, the second pixel electrode 321, and the third pixel electrode 331.

The counter electrode 305 on the intermediate layer 303 may be integrally formed over the first pixel electrode 311 through the third pixel electrode 331, like the intermediate layer 303. The counter electrode 305 may include a light-transmitting conductive layer formed of ITO, $In_2O_3$, or IZO, and may include a semi-transmissive film including a metal such as aluminum (Al), lithium (Li), magnesium (Mg), ytterbium (Yb), or silver (Ag). For example, the counter electrode 305 may include a semi-transmissive film including MgAg, AgYb, Yb/MgAg, or Li/MgAg.

The pixel-defining film 150 may be located on the planarization layer 140. The pixel-defining film 150 has an opening corresponding to each pixel. That is, the pixel-defining film 150 covers an edge of each of the first pixel electrode 311, the second pixel electrode 321, and the third pixel electrode 331, and has an opening through which a central portion of the first pixel electrode 311 is exposed, an opening through which a central portion of the second pixel electrode 321 is exposed, and an opening through which a central portion of the third pixel electrode 331 is exposed. As such, the pixel-defining film 150 may define a pixel. Also, as shown in FIG. 1, the pixel-defining film 150 may increase a distance between the counter electrode 305, and an edge of each of the first pixel electrode 311, the second pixel electrode 321, and the third pixel electrode 331, to prevent or reduce instances of an arc or the like occurring on the edge of each of the first pixel electrode 311, the second pixel electrode 321, and the third pixel electrode 331. The pixel-defining film 150 may include an organic material such as polyimide or hexamethyldisiloxane (HMDSO).

The emission layer included in the intermediate layer 303 may emit light having a wavelength in a first wavelength band. For example, the first wavelength band may range from 450 nm to 495 nm.

The first substrate 400 is located over the second substrate 100, with the first pixel electrode 311, the second pixel electrode 321, and the third pixel electrode 331 therebetween. The first substrate 400 may include glass or a polymer resin. The first substrate 400 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. Various modifications may be made. For example, the first substrate 400 may have a multi-layer structure including two layers each including a polymer resin and a barrier layer including an inorganic material (e.g., silicon oxide, silicon nitride, or silicon oxynitride) and located between the two layers. According to some embodiments, the first substrate 400 may be flexible or bendable.

The bank 500 is located on a bottom surface 400*b* of the first substrate 400 in a direction (−z direction) toward the second substrate 100. That is, the bank 500 is located between the first substrate 400 and the second substrate 100. The bank 500 includes first wells 501, second wells 502, third wells 503, fourth wells 504, and auxiliary wells AOP. According to some embodiments, the first wells 501, the second wells 502, the third wells 503, the fourth wells 504, and the auxiliary wells AOP may pass through the bank 500. In this case, widths $d_{aw}$ and $d_w$ of partition walls defining the first wells 501, the second wells 502, the third wells 503, the fourth wells 504, and the auxiliary wells AOP may be the same as or similar to one another.

The first well 501 of the bank 500 is located to correspond to the opening of the pixel-defining film 150 through which the first pixel electrode 311 is exposed, the second well 502 of the bank 500 is located to correspond to the opening of the pixel-defining film 150 through which the second pixel electrode 321 is exposed, and the third well 503 of the bank 500 is located to correspond to the opening of the pixel-defining film 150 through which the third pixel electrode 331 is exposed. That is, when viewed in a direction (z axis direction) perpendicular to a top surface 400*a* of the first substrate 400, the first well 501 of the bank 500 overlaps the opening of the pixel-defining film 150 through which the first pixel electrode 311 is exposed, the second well 502 of the bank 500 overlaps the opening of the pixel-defining film 150 through which the second pixel electrode 321 is exposed, and the third well 503 of the bank 500 overlaps the opening of the pixel-defining film 150 through which the third pixel electrode 331 is exposed. Accordingly, when viewed in the direction (z axis direction) perpendicular to the top surface 400*a* of the first substrate 400, a shape of an edge of each of the first well 501 through the third well 503 of the bank 500 may be the same as or similar to that of an edge of the corresponding opening of the pixel-defining film 150. Accordingly, the first well 501 of the bank 500 may be located to correspond to the first pixel electrode 311, the second well 502 of the bank 500 may be located to correspond to the second pixel electrode 321, and the third well 503 of the bank 500 may be located to correspond to the third pixel electrode 331.

The bank 500 may be formed of any of various materials, and may include an inorganic material such as silicon oxide, silicon nitride, and/or silicon oxynitride. When necessary, the bank 500 may include a photoresist material, and in this case, the bank 500 may be easily formed through a process such as exposure and development.

A first quantum dot layer 415 may be located in the first wells 501 of the bank 500. The first quantum dot layer 415 may overlap the first pixel electrode 311 when viewed in the direction (z axis direction) perpendicular to the top surface 400*a* of the first substrate 400. The first quantum dot layer 415 may convert light having a wavelength in the first wavelength passing through the first quantum dot layer 415 into light having a wavelength in a second wavelength. The second wavelength band may range from, for example, about 630 nm to about 780 nm. However, the disclosure is not limited thereto, and a wavelength to which a wavelength converted by the first quantum dot layer 415 belongs and a wavelength band to which a wavelength after conversion belongs may be modified differently.

The first quantum dot layer 415 may be formed so that quantum dots are dispersed in a resin. In the present description, the following embodiments, and modifications thereof, quantum dots may refer to semiconductor compound crystals, and may include any material capable of emitting light having various wavelengths according to sizes of crystals. A diameter of each of the quantum dots may range, for example, from about 1 nm to about 10 nm.

Quantum dots may be synthesized by using a wet chemical process, metal organic chemical deposition, molecular beam epitaxy, or the like. A wet chemical process is a method of mixing an organic solvent with a precursor material and then growing quantum dot crystals. In a wet chemical process, when crystals are grown, because an organic solvent naturally functions as a dispersant coordinated on quantum dot crystal surfaces and controls the growth of the crystals, the wet chemical process is easier than a vapor deposition method such as organic metal chemical vapor deposition (MOCVD) or molecular beam epitaxy (MBE). Also, the wet chemical process is inexpensive and may control the growth of quantum dot particles.

Such quantum dots may include a group III-VI semiconductor compound, a group II-VI semiconductor compound, a group III-V semiconductor compound, a group I-III-VI semiconductor compound, a group IV-VI semiconductor compound, a group IV element or compound, or any combination thereof.

Examples of the group III-VI semiconductor compound may include a binary compound such as GaS, GaSe, $Ga_2Se_3$, GaTe, InS, InSe, $In_2Se_3$, or InTe, a ternary compound such as $InGaS_3$ or $InGaSe_3$, and any combination thereof.

Examples of the group II-VI semiconductor compound may include a binary compound such as CdS, CdSe, CdTe, ZnS, ZnSe, ZnTe, ZnO, HgS, HgSe, HgTe, MgSe, or MgS, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS, a quaternary compound such as CdZnSeS, CdZnSeTe, CdZnSTe, CdHgSeS, CdHgSeTe, CdHgSTe, HgZnSeS, HgZnSeTe, or HgZnSTe, and any combination thereof.

Examples of the group III-V semiconductor compound may include a binary compound such as GaN, GaP, GaAs, GaSb, AlN, AlP, AlAs, AlSb, InN, InP, InAs, or InSb, a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or GaAlNP, a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb, and any combination thereof. The group III-V semiconductor compound may further include a group II element. Examples of the group III-V semiconductor compound further including the group II element may include InZnP, InGaZnP, and InAlZnP.

Examples of the group semiconductor compound may include a ternary compound such as AgInS, $AgInS_2$, CuInS, $CuInS_2$, $CuGaO_2$, $AgGaO_2$, or $AgAlO_2$, and any combination thereof.

Examples of the group IV-VI semiconductor compound may include a binary compound such as SnS, SnSe, SnTe, PbS, PbSe, or PbTe, a ternary compound such as SnSeS, SnSeTe, SnSTe, PbSeS, PbSeTe, PbSTe, SnPbS, SnPbSe, or SnPbTe, a quaternary compound such as SnPbSSe, SnPbSeTe, or SnPbSTe, and any combination thereof.

Examples of the group IV element or compound may include a single-element compound such as Si or Ge, a binary compound such as SiC or SiGe, and any combination thereof.

Elements included in a multi-element compound such as a binary compound, a ternary compound, or a quaternary compound may exist in particles at a uniform concentration or a non-uniform concentration.

A quantum dot may have a core-shell structure or a single structure having a uniform element concentration in the quantum dot. For example, a material included in a core and a material included in a shell may be different from each other. The shell of the quantum dot may serve as a protective layer for maintaining semiconductor characteristics by preventing or reducing chemical degeneration of the core and/or a charging layer for providing electrophoretic characteristics to the quantum dot. The shell may have a single or multi-layer structure. An interface between the core and the shell may have a concentration gradient in which a concentration of an element in the shell gradually decreases toward the center.

Examples of the shell of the quantum dot may include a metallic or non-metallic oxide, a semiconductor compound, and a combination thereof. Examples of the metallic or non-metallic oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, a ternary compound such as $MgAl_2O_4$, $CoFe_2O_4$, $NiFe_2O_4$, or $CoMn_2O_4$, and any combination thereof. Examples of the semiconductor compound may include, as described above, a group III-VI semiconductor compound, a group II-VI semiconductor compound, a group III-V semiconductor compound, a group I-III-VI semiconductor compound, a group IV-VI semiconductor compound, and any combination thereof. Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and any combination thereof.

A quantum dot may have a full width at half maximum (FWHM) of an emission wavelength spectrum of about 45 nm or less, specifically about 40 nm or less, and more specifically about 30 nm or less. When the FWHM is in this range, color purity or color reproducibility may be improved. Also, because light emitted through the quantum dot is emitted in all directions, an optical viewing angle may be improved.

Also, particularly, a quantum dot may be a spherical, pyramid, multi-arm, or cubic-shaped nano particle, nanotube, nano-wire, nano-fiber, or nano-plate particle.

Because an energy band gap may be adjusted by adjusting a size of a quantum dot, light of various wavelength bands may be obtained through a quantum dot emission layer. Accordingly, a light-emitting device for emitting light having various wavelengths may be realized by using quantum dots having different sizes. In detail, a size of a quantum dot may be selected to emit red light, green light, and/or blue light. Also, a size of a quantum dot may be selected to emit white light by combining light of various colors.

The first quantum dot layer 415 may include a scatterer. Because incident light is scattered by the scatterer included in the first quantum dot layer 415, the incident light may be efficiently converted by the quantum dots in the first quantum dot layer 415. The scatterer is not particularly limited as long as it is capable of partially scattering transmitted light by forming an optical interface between the scatterer and a light-transmitting resin. For example, the scatterer may be metal oxide particles or organic particles. Examples of a metal oxide for the scatterer may include titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$), and examples of an organic material for the scatterer may include an acrylic resin and a urethane resin. The scatterer may scatter light in several directions regardless of an angle of incidence without substantially converting a wavelength of incident light. Accordingly, the scatterer may improve side visibility of the display apparatus. Also, the scatterer included in the first quantum dot layer 415 may increase the probability that light incident on the first quantum dot layer 415 meets the quantum dots, thereby improving light conversion efficiency.

The resin included in the first quantum dot layer 415 may be any resin as long as it has excellent scattering characteristics for the scatterer and is a light-transmitting material. For example, a polymer resin such as acrylic resin, an imide-based resin, an epoxy resin, benzocyclobutene (BCB), or hexamethyldisiloxane (HMDSO) may be used as a material for forming the first quantum dot layer 415. The material for forming the first quantum dot layer 415 may be located in the first well 501 of the bank 500 overlapping the first pixel electrode 311, through inkjet printing.

A second quantum dot layer 425 may be located in the second wells 502 of the bank 500. The second quantum dot layer 425 may overlap the second pixel electrode 321 when viewed in the direction (z axis direction) perpendicular to the top surface 400*a* of the first substrate 400. The second quantum dot layer 425 may convert light having a wavelength in the first wavelength band passing through the second quantum dot layer 425 into light having a wavelength in a third wavelength band. The third wavelength band may range from, for example, about 495 nm to about 570 nm. However, the disclosure is not limited thereto, and a wavelength band to which a wavelength converted by the second quantum dot layer 425 belongs and a wavelength band to which a wavelength after conversion belongs may be modified differently.

The second quantum dot layer 425 may be formed so that quantum dots are dispersed in a resin. According to some embodiments, the following embodiments, and modifications thereof, quantum dots may refer to semiconductor compound crystals, and may include any material capable of emitting light having various wavelengths according to sizes of crystals. A diameter of each of the quantum dots may range from, for example, about 1 nm to about 10 nm. The description of the quantum dots included in the first quantum dot layer 415 may be applied to the quantum dots included in the second quantum dot layer 425, and thus, a description of the quantum dots included in the second quantum dot layer 425 will be omitted.

The second quantum dot layer 425 may include a scatterer. Because incident light is scattered by the scatterer included in the second quantum dot layer 425, the incident light may be efficiently converted by the quantum dots in the second quantum dot layer 425. The scatterer is not particularly limited as long as it is capable of partially scattering transmitted light by forming an optical interface between the scatterer and a light-transmitting resin. For example, the scatterer may be metal oxide particles or organic particles. A metal oxide for the scatterer or an organic material for the scatterer are the same as described above. The scatterer may scatter light in several directions regardless of an angle of incidence without substantially converting a wavelength of incident light. Accordingly, the scatterer may improve side visibility of the display apparatus. Also, the scatterer included in the second quantum dot layer 425 may increase the probability that light incident on the second quantum dot layer 425 meets the quantum dots, thereby improving light conversion efficiency.

The resin included in the second quantum dot layer 425 may be any resin as long as it has excellent distribution characteristics for the scatterer and is a light-transmitting material. For example, a polymer resin such as an acrylic resin, an imide-based resin, an epoxy resin, BCB, or HMDSO may be used as a material for forming the second quantum dot layer 425. The material for forming the second quantum dot layer 425 may be located in the second well 502 of the bank 500 overlapping the second pixel electrode 321, through inkjet printing.

The third pixel PX3 emits light having a wavelength in the first wavelength band generated by the intermediate layer 303 including the emission layer to the outside through the first substrate 400 without wavelength conversion. Accordingly, the third pixel PX3 does not include a quantum dot layer. Hence, a light-transmitting layer 435 including a light-transmitting resin may be located in the third well 503 of the bank 500 overlapping the third pixel electrode 331. The light-transmitting layer 435 may include acryl, BCB, or HMDSO. In addition, the light-transmitting layer 435 may include a scatterer. When necessary, unlike in FIG. 1, the light-transmitting layer 435 may not be located in the third well 503 of the bank 500.

As described above, the first quantum dot layer 415 and the second quantum dot layer 425 may be formed by using inkjet printing. That is, after the bank 500 including the first well 501, the second well 502, and the third well 503 is formed on the first substrate 400, the first quantum dot layer

415 and the second quantum dot layer 425 may be formed by dotting the material for forming the first quantum dot layer 415 in the first well 501 by using inkjet printing and dotting the material for forming the second quantum dot layer 425 in the second well 502 by using inkjet printing.

In this case, when the material for forming the first quantum dot layer 415 is dotted by using inkjet printing, the material may not be located in the first well 501, and when the material for forming the second quantum dot layer 425 is dotted, the material may not be located in the second well 502. In this case, in order to reduce the probability that the material for forming the first quantum dot layer 415 is located in the second well 502 or the third well 503 and the probability that the material for forming the second quantum dot layer 425 is located in the first well 501 or the third well 503, the display apparatus according to some embodiments includes the auxiliary wells AOP surrounding the first well 501, the second well 502, the third well 503, and the fourth well 504 in the bank 500 as shown in FIGS. 1 through 3.

Accordingly, when the material for forming the first quantum dot layer 415 is dotted by using inkjet printing, even if the material is not located in the first well 501, the material may be located in the auxiliary well AOP, thereby reducing the probability that the material is located in the second well 502 or the third well 503. Also, when the material for forming the second quantum dot layer 425 is dotted by using inkjet printing, even if the material is not located in the second well 502, the material may be located in the auxiliary well AOP, thereby reducing the probability that the material is located in the first well 501 or the third well 503.

The auxiliary wells AOP may include first auxiliary wells 510 adjacent to the first well 501, second auxiliary wells 520 adjacent to the second well 502, third auxiliary wells 530 adjacent to the third well 503, and fourth auxiliary wells 540 adjacent to the fourth well 504, as shown in FIG. 2. In the specification, when A and B are adjacent to each other, it means that a part of a partition wall defining A is a part of a partition wall defining B. In other words, A and B share the same partition wall. Accordingly, when a partition wall shared by A and B is lost, a material located in A may flow out to B, or a material located in B may flow out to A.

One auxiliary well AOP may be included in at least one of the first auxiliary wells 510, the second auxiliary wells 520, the third auxiliary wells 530, or the fourth auxiliary wells 540. In this regard, in FIG. 2, the first auxiliary wells 510 adjacent to the first well 501 include 1-1$^{th}$ through 1-10$^{th}$ auxiliary wells 510*a*, . . . , and 510*j*. For example, the 1-4$^{th}$ auxiliary well 510*d* and the 1-5$^{th}$ auxiliary well 510*e* are located between the first well 501 and the third well 503, and the 1-4$^{th}$ auxiliary well 510*d* and the 1-5$^{th}$ auxiliary well 510*e* are adjacent to the first well 501 and the third well 503. Accordingly, the 1-4$^{th}$ auxiliary well 510*d* and the 1-5$^{th}$ auxiliary well 510*e* may be included in both the first auxiliary wells 510 and the third auxiliary wells 530. Likewise, the 1-6$^{th}$ auxiliary well 510*f* is located between the first well 501 and the second well 502, and the 1-6$^{th}$ auxiliary well 510*f* is adjacent to the first well 501 and the second well 502. Accordingly, the 1-6$^{th}$ auxiliary well 510*f* may be included in the first auxiliary wells 510 and may be included in the second auxiliary wells 520.

An area of each of the first auxiliary wells 510 adjacent to the first well 501 may be proportional to an area of the first well 501. For example, according to some embodiments, when the first well 501 includes the first quantum dot layer 415 for converting light having a wavelength in the first wavelength band into light having a wavelength in the second wavelength band (from about 630 nm to about 780 nm), an area of each of the first auxiliary wells 510 may be equal to or less than about 27% of an area of the first well 501. For example, when the first pixel PX1 emits red light, even if a part of a partition wall defining the first well 501 is lost and a material for forming the first quantum dot layer 415 leaks to the first auxiliary well 510, visibility of a change in a luminance of the corresponding pixel may be prevented or reduced.

According to some embodiments, an area of each of the first auxiliary wells 510 may be equal to or less than about 23% of an area of the first well 501. When an area of each of the first auxiliary wells 510 is equal to or less than about 23% of an area of the first well 501, even if a part of a partition wall defining the first well 501 is lost and a material for forming the first quantum dot layer 415 located in the first well 501 leaks to the first well 510, the first quantum dot layer 415 may be formed to have a sufficient thickness (e.g., a height in the z direction). For reference, a thickness of the first quantum dot layer 415 may be 9 μm. Because an area of each of the first auxiliary wells 510 is equal to or less than 23% of an area of the first well 501, even when a part of a partition wall defining the first well 501 is lost, a thickness of the first quantum dot layer 415 may be prevented from being reduced by 2 μm or more.

Likewise, an area of each of the second auxiliary wells 520 adjacent to the second well 502 may be proportional to an area of the second well 502. According to some embodiments, when the second well 502 includes the second quantum dot layer 425 for converting light in the first wavelength band into light having a wavelength in the third wavelength band (from about 495 nm to about 570 nm), an area of each of the second auxiliary wells 520 may be equal to or less than about 45% of an area of the second well 502. For example, when the second pixel PX2 emits green light, even if a part of a partition wall defining the second well 502 is lost and a material for forming the second quantum dot layer 425 leaks to the second auxiliary well 520, visibility of a change in a luminance of the corresponding pixel may be prevented or reduced.

According to some embodiments, an area of each of the second auxiliary wells 520 may be equal to or less than about 23% of an area of the second well 502. When an area of each of the second auxiliary wells 520 is equal to or less than about 23% of an area of the second well 502, even if a part of a partition wall defining the second well 502 is lost and a material for forming the second quantum dot layer 425 located in the second well 502 leaks to the second auxiliary well 520, the second quantum dot layer 425 may be formed to have a sufficient thickness (e.g., a height in the z direction).

The light-transmitting layer 435 is located in the third well 503 as described above. Even when a part of a partition wall defining the third well 503 is lost and a material for forming the light-transmitting layer 435 dotted by using inkjet printing in a manufacturing process leaks to the outside of the third well 503, there may not be a large change in the amount of light emitted by the third pixel PX3 after the manufacturing process. However, because the light-transmitting layer 435 includes a scatterer or the like, it may be desirable to minimize the amount of leakage of a material for forming the light-transmitting layer 435.

Accordingly, an area of each of the third auxiliary wells 530 adjacent to the third well 503 may be proportional to an area of the third well 503. For example, according to some embodiments, an area of each of the third auxiliary well 530 may be equal to or less than about 77% of an area of the third well 503. For example, when the third pixel PX3 emits blue light, even if a part of a partition wall defining the third well 503 is lost and a material for forming the light-transmitting layer 435 leaks to the third auxiliary well 530, visibility of a change in a luminance of the corresponding pixel may be prevented or reduced.

According to some embodiments, an area of each of the third auxiliary wells 530 may be equal to or less than about 23% of an area of the third well 503. When an area of each of the third auxiliary well 530 is equal to or less than about 23% of an area of the third well 503, even when a part of a partition wall defining the third well 503 is lost and a material for forming the light-transmitting layer 435 located in the third well 503 leaks to the third auxiliary well 530, the light-transmitting layer 435 may be formed to have a sufficient thickness (e.g., a height in the z direction).

The fourth well 504 does not correspond to the first pixel PX1, the second pixel PX2, and the third pixel PX3. That is, the fourth well 504 does not overlap the first pixel electrode 311, the second pixel electrode 321, and the third pixel electrode 331. Accordingly, the first quantum dot layer 415, the second quantum dot layer 425, and the light-transmitting layer 435 may not be located in the fourth well 504. Even when there is no material in the fourth well 504, the fourth auxiliary wells 540 are located between the fourth well 504, and the first well 501, the second well 502, and the third well 503.

Even when a part of a partition wall defining the fourth well 504 is lost, a material for forming the first quantum dot layer 415, a material for forming the second quantum dot layer 425, or a material for forming the light-transmitting layer 435 may leak to the fourth well 504, and thus, visibility of a change in a luminance of a corresponding pixel may be prevented or reduced.

As described above, one auxiliary well AOP may be included in at least one of the first auxiliary wells 510, the second auxiliary wells 520, the third auxiliary wells 530, or the fourth auxiliary wells 540. For example, according to some embodiments, as illustrated in FIG. 2, the 1-4$^{th}$ auxiliary well 510*d* is adjacent to the first well 501 and the third well 503, and is included in the first auxiliary wells 510 and is included in the third auxiliary wells 530. According to some embodiments, an area of the 1-4$^{th}$ auxiliary well 510*d* may be equal to or less than a smaller area from among about 27% or less of an area of the first well 501 and about 77% or less of an area of the third well 503. According to some embodiments, an area of the 1-4$^{th}$ auxiliary well 510*d* may be equal to or less than a smaller area from among about 23% or less of an area of the first well 501 and about 77% or less of an area of the third well 503. According to some embodiments, an area of the 1-4$^{th}$ auxiliary well 510*d* may be equal to or less than a smaller area from among about 27% or less of an area of the first well 501 and about 23% or less of an area of the third well 503. According to some embodiments, an area of the 1-4$^{th}$ auxiliary well 510*d* may be equal to or less than a smaller area from among about 23% or less of an area of the first well 501 and about 23% or less of an area of the third well 503.

According to some embodiments, as illustrated in FIG. 2, the 1-7$^{th}$ auxiliary well 510*g* is adjacent to the first well 501, the second well 502, and the third well 503, and is included in the first auxiliary wells 510, the second auxiliary wells 520, and the third auxiliary wells 530. According to some embodiments, an area of the 1-7$^{th}$ auxiliary well 510*g* may be equal to or less than a smallest area from among about 27% or less of an area of the first well 501, about 45% or less of an area of the second well 502, and about 77% or less of an area of the third well 503. According to some embodiments, an area of the 1-7$^{th}$ auxiliary well 510*g* may be equal to or less than a smallest area from among about 23% or less of an area of the first well 501, about 45% or less of an area of the second well 502, and about 77% or less of an area of the third well 503. According to some embodiments, an area of the 1-7$^{th}$ auxiliary well 510*g* may be equal to or less than a smallest area from among about 27% or less of an area of the first well 501, about 23% or less of an area of the second well 502, and about 77% or less of an area of the third well 503. According to some embodiments, an area of the 1-7$^{th}$ auxiliary well 510*g* may be equal to or less than a smallest area from among about 27% or less of an area of the first well 501, about 45% or less of an area of the second well 502, and about 23% or less of an area of the third well 503. According to some embodiments, an area of the 1-7$^{th}$ auxiliary well 510*g* may be equal to or less than a smallest area from among about 23% or less of an area of the first well 501, about 23% or less of an area of the second well 502, and about 77% or less of an area of the third well 503. According to some embodiments, an area of the 1-7$^{th}$ auxiliary well 510*g* may be equal to or less than a smallest area from among about 23% or less of an area of the first well 501, about 45% or less of an area of the second well 502, and about 23% or less of an area of the third well 503. According to some embodiments, an area of the 1-7$^{th}$ auxiliary well 510*g* may be equal to or less than a smallest area from among about 27% or less of an area of the first well 501, about 23% or less of an area of the second well 502, and about 23% or less of an area of the third well 503. According to some embodiments, an area of the 1-7$^{th}$ auxiliary well 510*g* may be equal to or less than a smallest area from among about 23% or less of an area of the first well 501, about 23% or less of an area of the second well 502, and about 23% or less of an area of the third well 503. Accordingly, an area of any one of the auxiliary wells AOP may be equal to or less than an area of another one of the auxiliary wells AOP.

Although 10 auxiliary wells 510*a*, . . . , and 510*j* are included in the first auxiliary well 510 in FIG. 2, the disclosure is not limited thereto. The number of auxiliary wells AOP included in the first auxiliary wells 510 may change as long as the above area-related rules are satisfied and the first well 501 is surrounded. For example, although the 1-4$^{th}$ auxiliary well 510*d* and the 1-5$^{th}$ auxiliary well 510*e* are located between the first well 501 and the third well 503 in FIG. 2, according to some embodiments, three auxiliary wells AOP may be located between the first well 501 and the third well 503.

Likewise, the number of second auxiliary wells 520, third auxiliary wells 530, and fourth auxiliary wells 540 may change as long as the second well 502, the third well 503, and the fourth well 504 are surrounded and the above area-related rules are satisfied.

Widths $d_{aw}$ and $d_w$ of partition walls defining the first well 501, the second well 502, the third well 503, the fourth well 504, and the auxiliary well AOP may be equal or similar to one another. For example, a width $d_w$ of a partition wall shared by the second well 502 and the 1-6$^{th}$ auxiliary well 510*f* and a width $d_{aw}$ of a partition wall shared by the 1-6$^{th}$ auxiliary well 510*f* and the 1-7$^{th}$ auxiliary well 510*g* may be equal or similar to each other. According to some embodiments, each of the widths $d_{aw}$ and $d_w$ of the partition walls may range from about 13 μm to about 15 μm. In the display apparatus according to some embodiments, because the widths $d_{aw}$ and $d_w$ of the partition walls defining the first well 501, the second well 502, the third well 503, the fourth well

504, and the auxiliary well AOP are sufficiently large, parts of the partition walls defining the first well 501, the second well 502, the third well 503, the fourth well 504, and the auxiliary well AOP may be prevented from being lost.

The first well 501, the second well 502, the third well 503, and the fourth well 504 of the bank 500 may be located on a plurality of imaginary lines, and the auxiliary wells AOP of the bank 500 may be located between the first well 501, the second well 502, the third well 503, and the fourth well 504. In this regard, in FIG. 2, the first well 501 and the third well 503 are located on a first imaginary line IL1 extending in a first direction (e.g., x direction), the second well 502 and the fourth well 504 extend in the first direction (e.g., x direction) and are located on a second imaginary line IL2 that is spaced apart from the first imaginary line IL1 in a second direction (e.g., y direction), and the auxiliary wells AOP are located between the first well 501, the second well 502, the third well 503, and the fourth well 504 that are spaced apart from one another. The first well 501 and the third well 503 may be alternately arranged on the first imaginary line IL1, and the second well 502 and the fourth well 504 may be alternately arranged on the second imaginary line IL2.

The center of the first well 501 and the center of the third well 503 located on the first imaginary line IL1 from among a plurality of lines may correspond to between the center of the second well 502 and the center of the fourth well 504 located on the second imaginary line IL2 closest to the first imaginary line IL2 from among the plurality of lines. That is, the auxiliary wells AOP located between the first well 501 and the third well 503 may substantially correspond to the center of the second well 502 or the center of the fourth well 504. Likewise, the auxiliary wells AOP located between the second well 502 and the fourth well 504 may substantially correspond to the center of the first well 501 or the third well 503. Accordingly, an overall structure of the bank 500 may be more robust.

As shown in FIG. 2, when viewed in a direction (e.g., z direction) perpendicular to the first substrate 400, each of the first well 501, the second well 502, the third well 503, the fourth well 504, and the auxiliary wells AOP may have a polygonal shape. According to some embodiments, each of the first well 501, the second well 502, and the third well 503 may have a quadrangular shape with a chamfered corner, and the fourth well 504 may have an octagonal shape. Each of the auxiliary wells AOP may be located between the first well 501, the second well 502, the third well 503, and the fourth well 504, and may have any of various polygonal shapes as long as it satisfies the above area-related rules.

Figure 4:
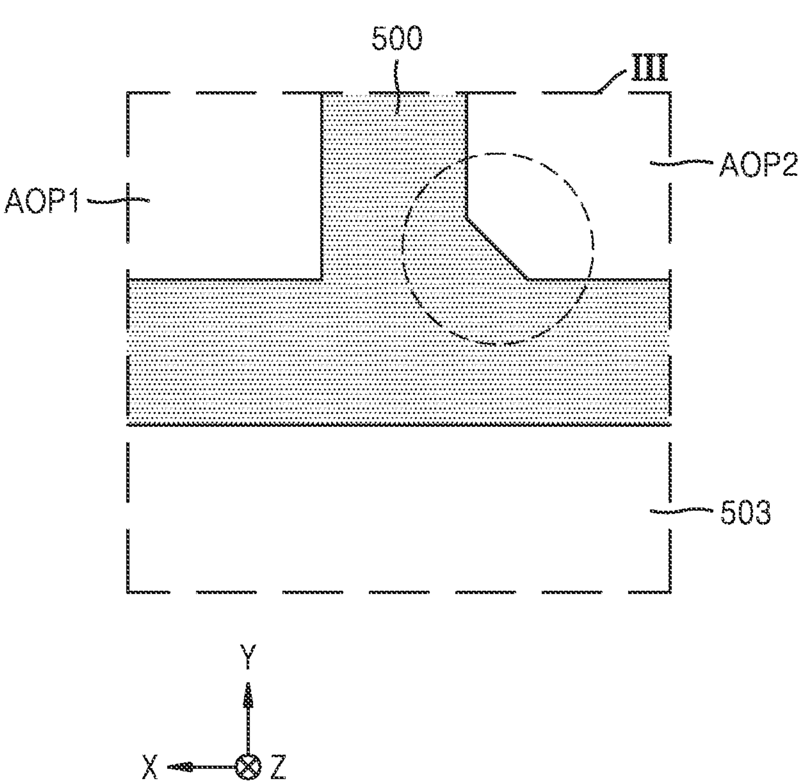
FIG. 4 is an enlarged plan view illustrating a portion III of FIG. 2 according to some embodiments.

According to some embodiments, one of corners of two auxiliary wells AOP1 and AOP2 formed when a partition wall extending in the first direction (e.g., x direction) and a partition wall extending in the second direction (e.g., y direction) perpendicular to the first direction (e.g., x direction) meet each other. This is illustrated in FIG. 4 that is an enlarged view of a portion III of FIG. 2. In FIG. 4, a chamfered portion is marked by a dashed circle. Accordingly, a portion where a partition wall and a partition wall meet each other may be sufficiently thick and a sufficient area of the auxiliary well AOP may be ensured.

Figure 5:
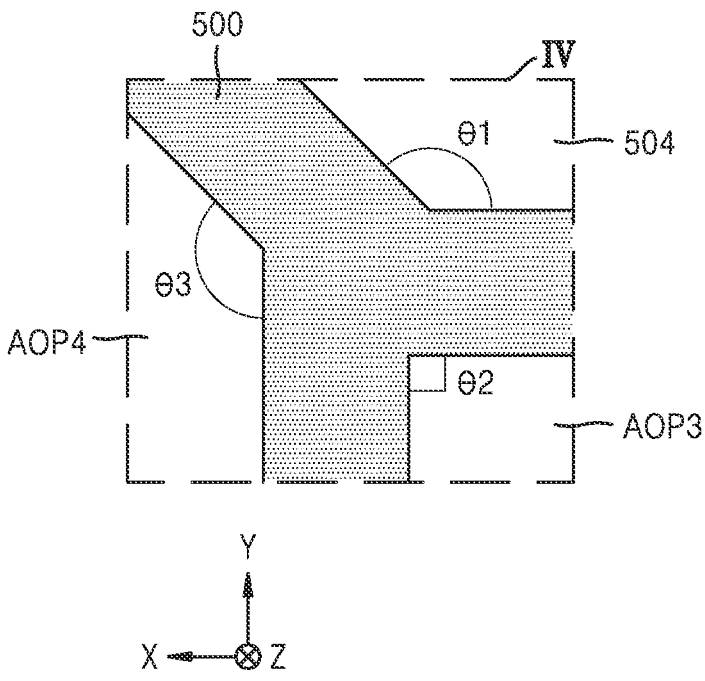
FIG. 5 is an enlarged plan view illustrating a portion IV of FIG. 2 according to some embodiments.

According to some embodiments, in the auxiliary wells AOP, a corner of a partition wall shared with the fourth well 504 may not be chamfered. For example, corners of two auxiliary wells AOP3 and AOP4 formed when a partition wall extending in the first direction (e.g., x direction), a partition wall extending in the second direction (e.g., y direction), and a partition wall extending in a third direction that intersects the first direction and the second direction meet one another may not be chamfered. This is illustrated in FIG. 5 that is an enlarged view of a portion IV of FIG. 2. In FIG. 5, when the fourth well 504 has an octagonal shape, three partition walls meet at one point to form a first angle 81, a second angle 82, and a third angle 83. In this case, even when portions where partition walls meet each other to form the first angle 81 and the third angle 83 that are obtuse angles (about 135°) are not chamfered, the bank 500 may have sufficient structural stability.

As shown in FIGS. 1 and 3, a color filter layer may be located between the bottom surface 400*b* of the first substrate 400 in a direction (e.g., −z direction) toward the second substrate 100, and the first quantum dot layer 415, the second quantum dot layer 425, and the light-transmitting layer 435. That is, a first color filter layer 410 may be located between the first substrate 400 and the first quantum dot layer 415, a second color filter layer 420 may be located between the first substrate 400 and the second quantum dot layer 425, and a third color filter layer 430 may be located between the first substrate 400 and the light-transmitting layer 435. The first color filter layer 410 may be a layer that passes only light having a wavelength ranging from 630 nm to 780 nm. The second color filter layer 420 may be a layer that passes only light having a wavelength ranging from 495 nm to 570 nm. The third color filter layer 430 may be a layer that passes only light having a wavelength ranging from 450 nm to 495 nm.

The first color filter layer 410 through the third color filter layer 430 may increase the color purity of light emitted to the outside and may improve the quality of a displayed image. Also, because the first color filter layer 410 through the third color filter layer 430 reduces a ratio of light, from among external light incident from the outside on the display apparatus, reflected by the first pixel electrode 311 through the third pixel electrode 331 and then emitted to the outside again, the reflection of external light may be reduced. When necessary, a black matrix may be located between the first color filter layer 410 through the third color filter layer 430.

The second color filter layer 420 and the third color filter layer 430 have an opening 421 through which a first area A1 is exposed as shown in FIG. 1. The opening 421 may define an area of the first pixel PX1. The first color filter layer 410 fills at least the opening 421. The first color filter layer 410 and the second color filter layer 420 have an opening 423 through which a third area A3 is exposed. The opening 423 may define an area of the third pixel PX3. Also, the first color filter layer 410 and the third color filter layer 430 have an opening 412 through which a second area A2 is exposed as shown in FIG. 3. The opening 412 may define an area of the second pixel PX2. The second color filter layer 420 fills at least the opening 412.

A portion where the first color filter layer 410 and the third color filter layer 430 overlap each other, a portion where the second color filter layer 420 and the third color filter layer 430 overlap each other, and a portion where the first color filter layer 410 and the second color filter layer 420 overlap each other may each function as a black matrix. In some embodiments, in portions other than the opening 421 through which the first area A1 is exposed, the opening 412 through which the second area A2 is exposed, and the opening 423 through which the third area A3 is exposed, the third color filter layer 430, the first color filter layer 410, and the second color filter layer 420 may be sequentially stacked on the first substrate 400 in the direction (e.g., −z direction) toward the second substrate 100.

In order to protect the first quantum dot layer 415, the second quantum dot layer 425, and the light-transmitting layer 435, as shown in FIGS. 1 and 3, a protective layer 600 may be located on a surface of the first quantum dot layer 415, the second quantum dot layer 425, and the light-transmitting layer 435 in a direction toward the second substrate 100. The protective layer 600 may include an inorganic material such as silicon oxide or silicon nitride. For example, the protective layer 600 may have a two-layer structure including a silicon oxide layer and a silicon nitride layer. When there is no material in the fourth well 504 and the auxiliary well AOP, the protective layer 600 may cover an inner surface and a bottom surface of each of the fourth well 504 and the auxiliary well AOP as shown in FIGS. 1 and 3.

A filler may fill a space between the first substrate 400 and the second substrate 100. For example, in the display apparatus as shown in FIG. 1, the filler may fill a space between the protective layer 600 and the counter electrode 305. The filler may include a light-transmitting material. For example, the filler may include an acrylic resin or an epoxy resin.

Figure 6:
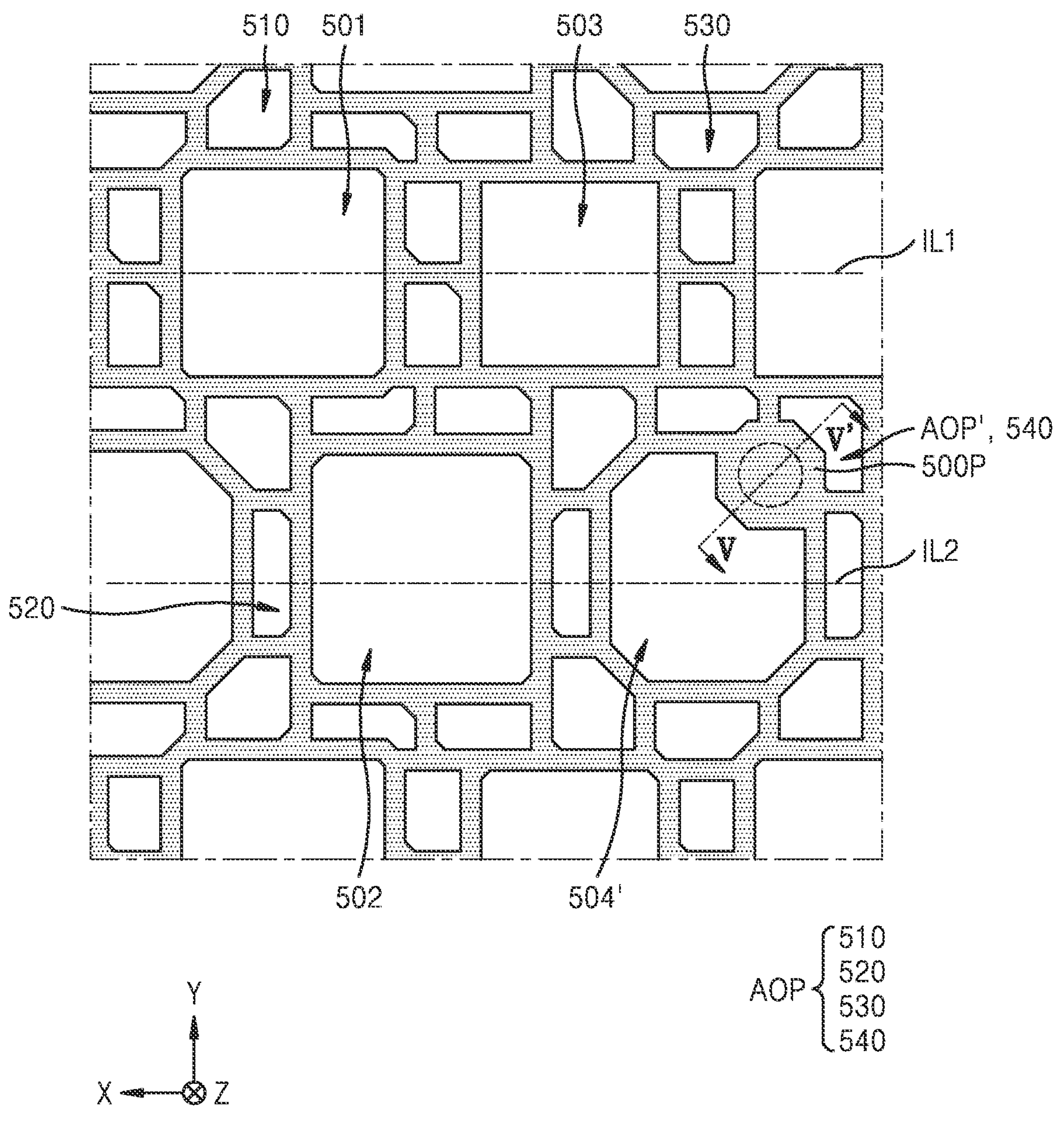
FIG. 6 is a plan view schematically illustrating a part of a display apparatus, according to some embodiments.
Figure 7:
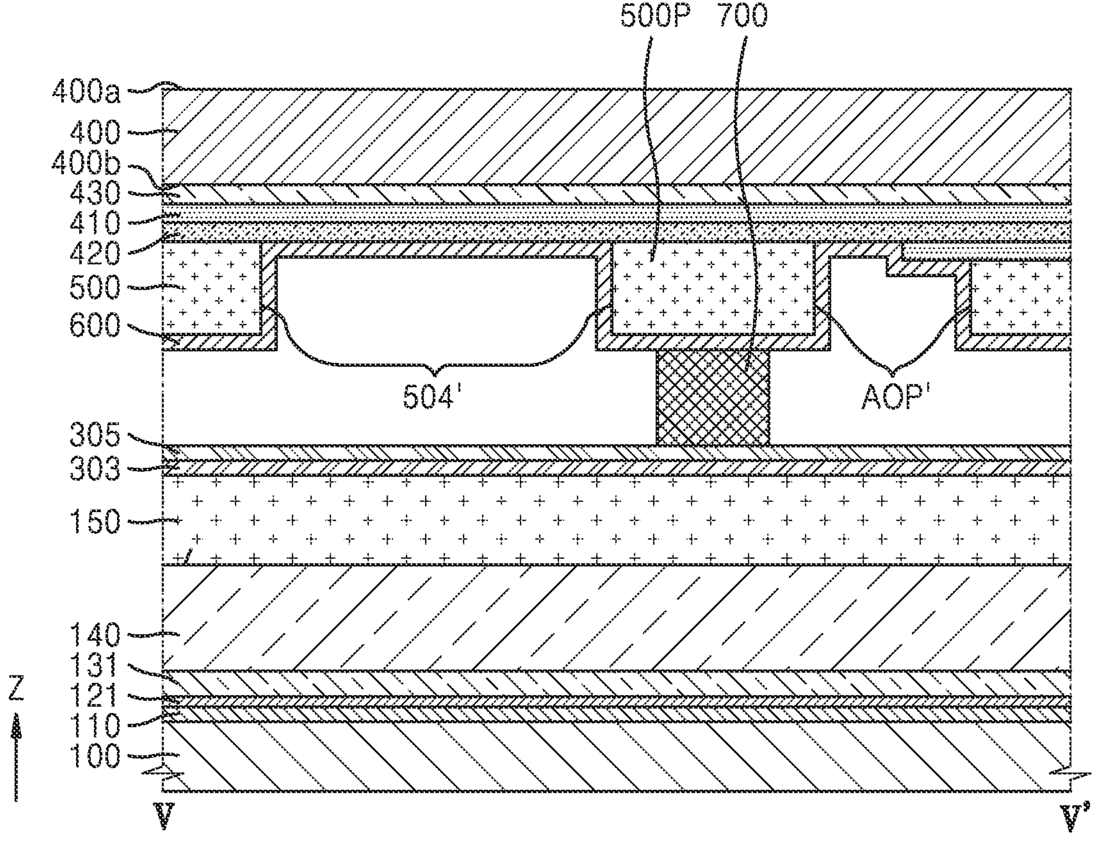
FIG. 7 is a cross-sectional view schematically illustrating the display apparatus of FIG. 6 taken along the line V-V of FIG. 6 according to some embodiments.

FIG. 6 is a plan view schematically illustrating a part of a display apparatus, according to some embodiments. FIG. 7 is a cross-sectional view schematically illustrating the display apparatus of FIG. 6 taken along the line V-V' of FIG. 6. The display apparatus according to some embodiments may include a spacer 700 as shown in FIG. 7 to maintain a constant interval between the second substrate 100 and the first substrate 400. To this end, the bank 500 may include a support 500P for locating the spacer 700.

The support 500P may overlap a fourth well 504' when viewed in a direction (e.g., z direction) perpendicular to a top surface of the first substrate 400. In this regard, in FIGS. 6 and 7, the fourth well 504' and auxiliary wells AOP' of some of the fourth auxiliary wells 540 overlap the support 500P. Accordingly, the fourth well 504' overlapping the support 500P may have a smaller area than other fourth wells 504 (see FIG. 2). Likewise, the auxiliary wells AOP' overlapping the support 500P may have a smaller area than other corresponding auxiliary wells AOP.

Figure 8:
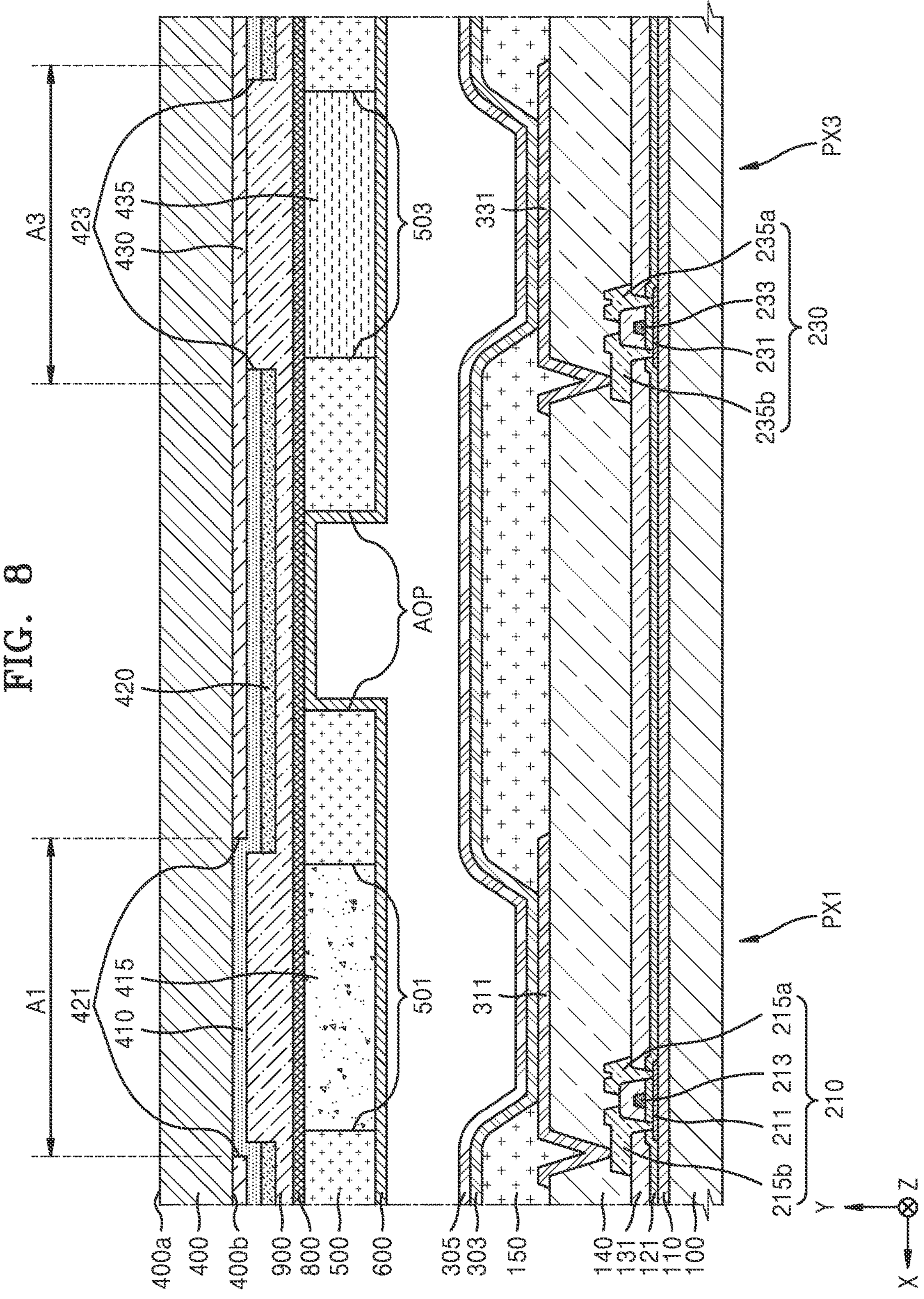
FIG. 8 is a cross-sectional view schematically illustrating a part of a display apparatus, according to some embodiments.
Figure 9:
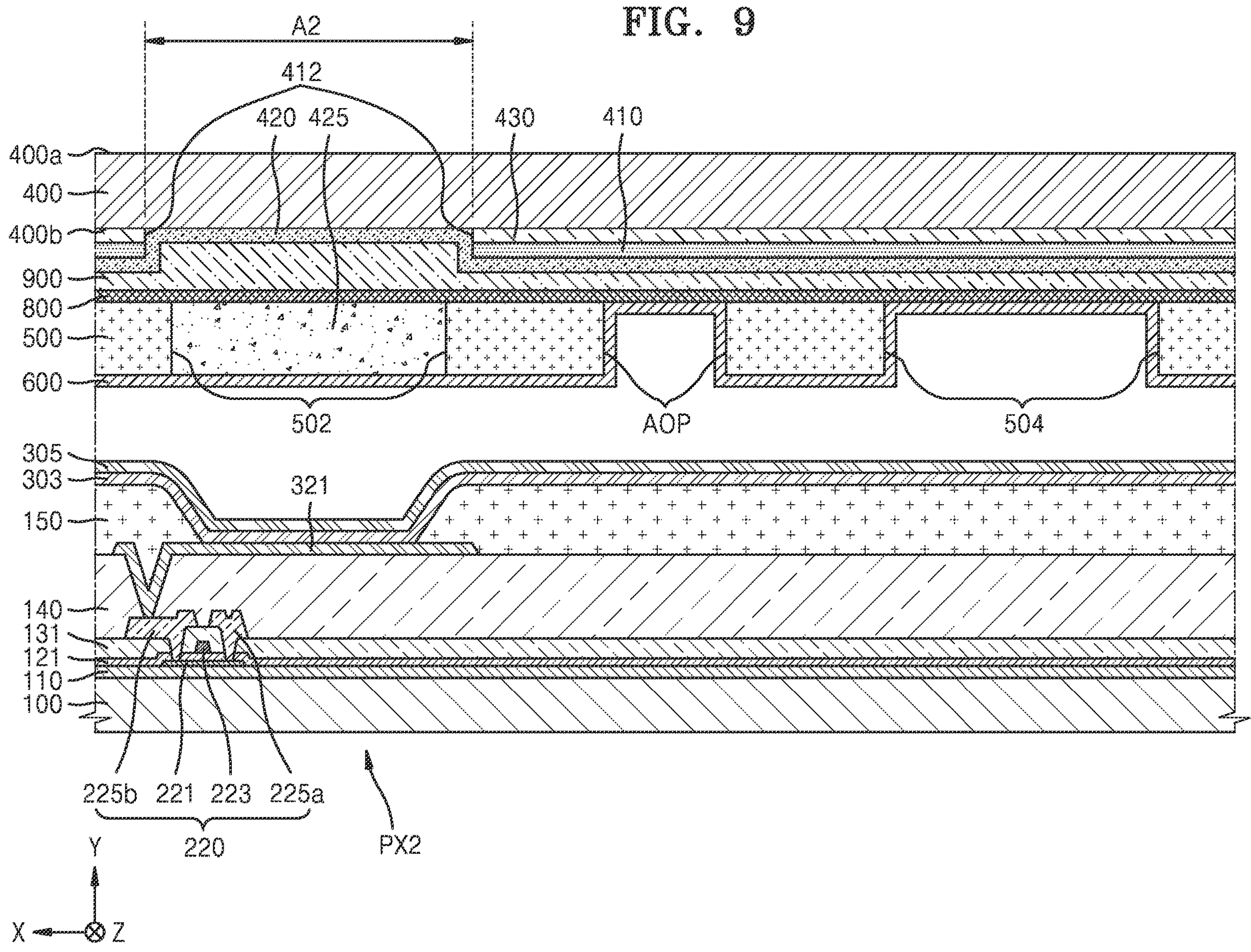
FIG. 9 is a cross-sectional view schematically illustrating a part of the display apparatus of FIG. 7 according to some embodiments.

FIG. 8 is a cross-sectional view schematically illustrating a part of a display apparatus, according to some embodiments. FIG. 9 is a cross-sectional view schematically illustrating a part of the display apparatus of FIG. 8. In the display apparatus according to some embodiments, a low-refractive index layer 900 may be further provided between the bank 500, and the first quantum dot layer 415, the second quantum dot layer 425, and the light-transmitting layer 435, and between the first color filter layer 410, the second color filter layer 420, and the third color filter layer 430. An additional protective layer 800 is further provided between the low-refractive index layer 900, and the first quantum dot layer 415, the second quantum dot layer 425, the light-transmitting layer 435, and the bank 500.

The low-refractive index layer 900 may include an organic material having a low refractive index, and may increase light extraction efficiency of light passing through the first quantum dot layer 415 and the second quantum dot layer 425 and extracted to the outside through the first substrate 400. The additional protective layer 800 may include silicon oxide or silicon nitride, and may protect, along with the protective layer 600, the first quantum dot layer 415 and the second quantum dot layer 425 by preventing or reducing penetration of external impurities into the first quantum dot layer 415 and the second quantum dot layer 425. When there is no material in the fourth well 504 or the auxiliary well AOP, the protective layer 600 may contact the additional protective layer 800 in the fourth well 504 and the auxiliary well AOP.

Figure 10A:
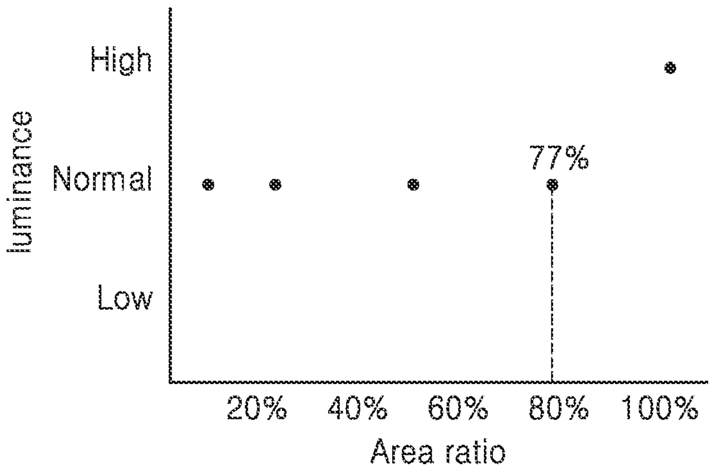
FIGS. 10A, 10B, and 10C are graphs illustrating a change in a luminance of a pixel according to a ratio between an area of a well corresponding to each pixel electrode and an area of an auxiliary well connected when a partition wall is lost according to some embodiments.
Figure 10B:
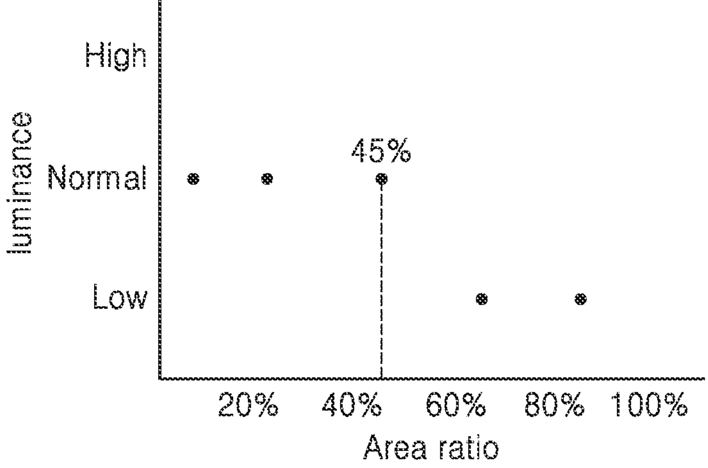
Figure 10C:
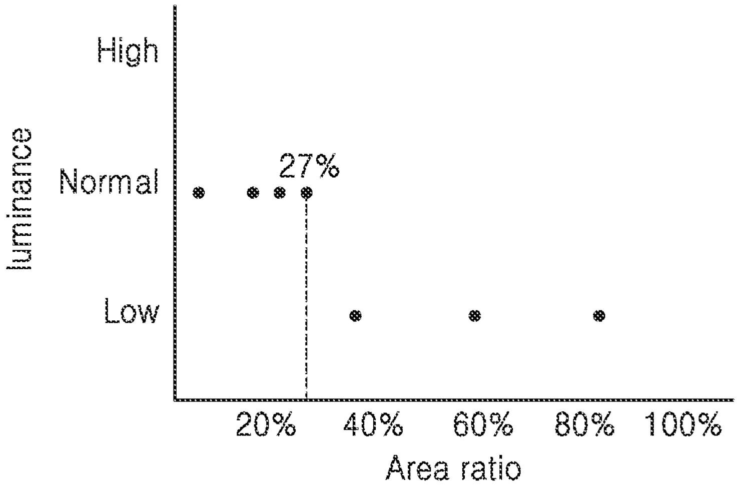

FIGS. 10A, 10B, and 10C are graphs illustrating a change in a luminance of a pixel according to a ratio between an area of a well corresponding to each pixel electrode and an area of an auxiliary well connected when a partition wall is lost. FIGS. 10A, 10B, and 10C are views results obtained after measuring whether a change in a luminance of a pixel is visible with eyes when a part of a partition wall of a well (e.g., the first well, the second well, or the third well) corresponding to each pixel electrode is removed and a material for forming a quantum dot layer leaks to connected auxiliary wells.

For example, a change in a luminance of a corresponding pixel was checked when a material for forming a first quantum dot layer leaks from the first well 501 to the 1-1$^{th}$ auxiliary well 510*a* by removing a partition wall between the first well 501 (see FIG. 2) and the 1-1$^{th}$ auxiliary well 510*a* (see FIG. 2), and a change in a luminance of a corresponding pixel was checked when a material for forming a first quantum dot layer leaks from the first well 501 to the 1-1$^{th}$ auxiliary well 510*a* and the 1-2$^{th}$ auxiliary well 510*b* by additionally removing a partition wall between the first well 501 and the 1-2$^{th}$ auxiliary well 510*b* (see FIG. 2). As such, whether a change in a luminance of a corresponding pixel is visible with eyes was measured by increasing an area of an auxiliary well connected to a well by removing some partition walls of a bank.

FIG. 10A is a graph illustrating a change in a luminance of a pixel that emits blue light. In FIG. 10A, a change in a luminance of a pixel was observed by changing an area ratio of the third auxiliary wells 530 (see FIG. 2) connected to the third well 503 (see FIG. 2) by removing some partition walls of a bank. When an area of the third auxiliary wells 530 connected to the third well 503 is equal to or less than 77% of an area of the third well 503, a change in a luminance of the pixel that emits blue light was not visible with eyes, whereas when the area exceeds 77%, it was recognized that the pixel had a higher luminance than a normal pixel. Accordingly, a maximum area of one third auxiliary well 530 in which defects are not visible when a partition wall is lost and the third auxiliary well 530 is connected to the third well 503 is equal to or less than 77% of an area of the third well 503.

FIG. 10B is a graph illustrating a change in a luminance of a pixel that emits green light. In FIG. 10B, a change in a luminance of a pixel was observed by changing an area ratio of the second auxiliary wells 520 (see FIG. 2) connected to the second well 502 (see FIG. 2) by removing some partition walls of a bank. When an area of the second auxiliary wells 520 connected to the second well 502 is equal to or less than 45% of an area of the second well 502, a change in a luminance of the pixel that emits green light was not visible with eyes, whereas when the area exceeds 45%, it was recognized that the pixel had a lower luminance than a normal pixel. Accordingly, a maximum area of one second auxiliary well 520 in which defects are not visible when a partition wall is lost and the second auxiliary well 520 is connected to the second well 502 is equal to or less than 45% of an area of the second well 502.

FIG. 10C is a graph illustrating a change in a luminance of a pixel that emits red light. In FIG. 10C, a change in a luminance of a pixel was observed by changing an area ratio of the first auxiliary wells 510 (see FIG. 2) connected to the first well 501 (see FIG. 2) by removing some partition walls of a bank. When an area of the first auxiliary wells 510 connected to the first well 501 is equal to or less than 27% of an area of the first well 501, a change in a luminance of the pixel that emits red light was not visible with eyes, whereas when the area exceeds 27%, it was recognized that the pixel had a lower luminance than a normal pixel. Accordingly, a maximum area of one first auxiliary well 510 in which defects are not visible when a partition wall is lost and the first auxiliary well 510 is connected to the first well 501 is equal to or less than 27% of an area of the first well 501.

As described above, according to some embodiments, a display apparatus having a relatively reduced risk of defects in a manufacturing process may be realized. However, the scope of embodiments according to the present disclosure are not limited by these characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims, and their equivalents.

What is claimed is:

1. A display apparatus comprising:

a first substrate;

a bank on the first substrate and comprising a first well, a second well, a third well, a fourth well, and auxiliary wells;

a first quantum dot layer in the first well; and a second quantum dot layer in the second well, wherein the first well, the second well, the third well, and the fourth well are spaced apart from one another with the auxiliary wells therebetween.

2. The display apparatus of claim 1, wherein the first quantum dot layer is configured to convert light having a wavelength in a first wavelength band passing through the first quantum dot layer into light having a wavelength in a second wavelength band, and the second quantum dot layer is configured to convert light having a wavelength in the first wavelength band passing through the second quantum dot layer into light having a wavelength in a third wavelength band.

3. The display apparatus of claim 2, wherein the second wavelength band comprises a wavelength ranging from 630 nm to 780 nm, wherein the auxiliary wells comprise a first auxiliary well adjacent to the first well, and an area of the first auxiliary well is equal to or less than 27% of an area of the first well.

4. The display apparatus of claim 2, wherein the third wavelength band comprises a wavelength ranging from 495 nm to 570 nm, wherein the auxiliary wells comprise a second auxiliary well adjacent to the second well, and an area of the second auxiliary well is equal to or less than 45% of an area of the second well.

5. The display apparatus of claim 1, further comprising a light-transmitting layer in the third well and configured to transmit incident light, wherein the auxiliary wells comprise a third auxiliary well adjacent to the third well, and an area of the third auxiliary well is equal to or less than 77% of an area of the third well.

6. The display apparatus of claim 1, wherein the auxiliary wells comprise a first auxiliary well adjacent to the first well, a second auxiliary well adjacent to the second well and a third auxiliary well adjacent to the third well, wherein an area of the first auxiliary well is equal to or less than 27% of an area of the first well, an area of the second auxiliary well is equal to or less than 45% of an area of the second well, and an area of the third auxiliary well is equal to or less than 77% of an area of the third well.

7. The display apparatus of claim 1, wherein each of the auxiliary wells is adjacent to at least one of the first well, the second well, or the third well, wherein an area of each of the auxiliary wells is equal to or less than 23% of an area of an adjacent well.

8. The display apparatus of claim 1, wherein the first well and the third well are alternately arranged on a first imaginary line extending in a first direction, and the second well and the fourth well are alternately arranged on a second imaginary line that is parallel to the first imaginary line and is spaced apart from the first imaginary line in a second direction that intersects the first direction.

9. The display apparatus of claim 8, wherein a center of the first well and a center of the third well located on the first imaginary line are located between a center of the second well and a center of the fourth well located on the second imaginary line.

10. The display apparatus of claim 8, wherein each of the first well, the second well, and the third well has a quadrangular shape in a plan view, and the fourth well has an octagonal shape in the plan view.

11. The display apparatus of claim 10, wherein each of the first well, the second well, and the third well has a quadrangular shape with a chamfered corner in the plan view.

12. The display apparatus of claim 1, further comprising color filters located between the first substrate, and the first quantum dot layer, the second quantum dot layer, and the bank.

13. The display apparatus of claim 12, further comprising a low-refractive index layer located between the color filters, and the first quantum dot layer, the second quantum dot layer, and the bank.

14. The display apparatus of claim 13, further comprising an additional protective layer between the low-refractive index layer, and the first quantum dot layer, the second quantum dot layer, and the bank.

15. The display apparatus of claim 1, wherein the bank comprises partition walls defining the first well, the second well, the third well, the fourth well, and the auxiliary wells, wherein a width of each of the partition walls ranges from 13 μm to 15 μm.

16. The display apparatus of claim 1, further comprising:

a second substrate under the first substrate with the bank therebetween;

a first pixel electrode corresponding to the first well, a second pixel electrode corresponding to the second well, and a third pixel electrode corresponding to the third well, the first, second, and third pixel electrodes being on the second substrate to be spaced apart from one another;

a pixel-defining film covering an edge of each of the first pixel electrode, the second pixel electrode, and the third pixel electrode, the pixel-defining film comprising an opening through which a central portion of the first pixel electrode is exposed, an opening through which a central portion of the second pixel electrode is exposed, and an opening through which a central portion of the third pixel electrode is exposed;

an emission layer on the first pixel electrode through the third pixel electrode and configured to emit light having a wavelength in a first wavelength band; and a counter electrode on the emission layer.

17. The display apparatus of claim 16, further comprising a spacer between the pixel-defining film and the bank, wherein the bank comprises a support for supporting the spacer.

18. The display apparatus of claim 17, further comprising the support overlaps the fourth well in a plan view.

19. The display apparatus of claim 17, wherein the auxiliary wells comprise a fourth auxiliary well adjacent to the fourth well, and the support overlaps the fourth auxiliary well in a plan view.

20. The display apparatus of claim 1, wherein the auxiliary wells have a polygonal shape in which at least one interior angle is an obtuse angle in a plan view.

* * * * *